United States Patent
Duong et al.

(10) Patent No.: US 10,823,382 B2
(45) Date of Patent: *Nov. 3, 2020

(54) SYSTEMS AND METHODS FOR LIGHTING FIXTURES

(71) Applicant: Fluence Bioengineering, Inc., Austin, TX (US)

(72) Inventors: Dung Duong, Austin, TX (US); Randy Johnson, Austin, TX (US); Nick Klase, Austin, TX (US)

(73) Assignee: Fluence Bioengineering, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/742,991

(22) Filed: Jan. 15, 2020

(65) Prior Publication Data
US 2020/0217490 A1 Jul. 9, 2020

Related U.S. Application Data

(63) Continuation of application No. 16/239,668, filed on Jan. 4, 2019, now Pat. No. 10,605,444, which is a
(Continued)

(51) Int. Cl.
*F21S 4/00* (2016.01)
*F21V 23/00* (2015.01)
(Continued)

(52) U.S. Cl.
CPC ............ *F21V 23/005* (2013.01); *A01G 7/045* (2013.01); *F21K 9/232* (2016.08); *F21K 9/90* (2013.01); *F21S 4/28* (2016.01); *F21V 7/005* (2013.01); *F21V 7/0066* (2013.01); *F21V 7/05* (2013.01); *F21V 15/015* (2013.01); *F21V 17/107* (2013.01); *F21V 19/003* (2013.01); *F21V 19/0015* (2013.01); *F21V 23/001* (2013.01); *F21V 23/02* (2013.01); *F21V 23/0442* (2013.01); *F21V 29/70* (2015.01); *F21V 29/74* (2015.01); *F21V 29/83* (2015.01); *H05K 1/0203* (2013.01); *H05K 1/0209* (2013.01); *H05K 1/0274* (2013.01); *H05K 1/0277* (2013.01); *H05K 1/05* (2013.01); *H05K 1/056* (2013.01); *H05K 1/181* (2013.01); *H05K 1/182* (2013.01); *H05K 1/185* (2013.01); *H05K 3/0014* (2013.01); *H05K 3/28* (2013.01); *H05K 3/32* (2013.01); *H05K 3/44* (2013.01); *F21Y 2103/10* (2016.08); *F21Y 2105/16* (2016.08);
(Continued)

(58) Field of Classification Search
CPC ............ F21Y 2103/00; F21Y 2103/37; F21Y 2105/00; F21Y 2105/10
USPC ...... 362/225, 227, 240, 241, 249.02, 249.04
See application file for complete search history.

(56) References Cited

U.S. PATENT DOCUMENTS 10,208,920 B2 * 2/2019 Duong ................. H05K 1/0277
10,605,444 B2 * 3/2020 Duong .................... A01G 7/045
(Continued)

*Primary Examiner* — Daniel St. Cyr
(74) *Attorney, Agent, or Firm* — Yutian Ling

(57) ABSTRACT

Examples of the present disclosure are related to systems and methods for lighting fixtures. More particularly, embodiments disclose lighting fixtures having a substrate with one or more light sources embedded on the bottom surface of the substrate and at least one panel extending along the sides of the substrate.

16 Claims, 12 Drawing Sheets

Related U.S. Application Data continuation of application No. 15/829,197, filed on Dec. 1, 2017, now Pat. No. 10,208,920.

(60) Provisional application No. 62/516,412, filed on Jun. 7, 2017.

(51) Int. Cl.

| | |
|---|---|
| *H05K 1/05* | (2006.01) |
| *H05K 1/18* | (2006.01) |
| *H05K 1/02* | (2006.01) |
| *H05K 3/32* | (2006.01) |
| *F21K 9/90* | (2016.01) |
| *F21V 29/74* | (2015.01) |
| *F21V 23/04* | (2006.01) |
| *F21V 29/70* | (2015.01) |
| *F21V 29/83* | (2015.01) |
| *F21K 9/232* | (2016.01) |
| *A01G 7/04* | (2006.01) |
| *F21V 7/00* | (2006.01) |
| *F21V 7/05* | (2006.01) |
| *H05K 3/00* | (2006.01) |
| *H05K 3/28* | (2006.01) |
| *H05K 3/44* | (2006.01) |
| *F21S 4/28* | (2016.01) |
| *F21V 15/015* | (2006.01) |
| *F21V 17/10* | (2006.01) |
| *F21V 19/00* | (2006.01) |
| *F21V 23/02* | (2006.01) |
| *F21Y 115/10* | (2016.01) |
| *H05B 45/10* | (2020.01) |
| *H05B 47/19* | (2020.01) |
| *H05B 47/105* | (2020.01) |
| *F21Y 105/16* | (2016.01) |
| *F21Y 103/10* | (2016.01) |

(52) U.S. Cl.
CPC ........... *F21Y 2115/10* (2016.08); *H05B 45/10* (2020.01); *H05B 47/105* (2020.01); *H05B 47/19* (2020.01); *H05K 2201/066* (2013.01); *H05K 2201/09009* (2013.01); *H05K 2201/10106* (2013.01)

(56) References Cited

U.S. PATENT DOCUMENTS

| | | | |
|---|---|---|---|
| 2013/0327560 A1* | 12/2013 | Ichiki | G06F 3/044 174/133 R |
| 2014/0029263 A1* | 1/2014 | Park | F21K 9/60 362/296.01 |
| 2016/0033105 A1* | 2/2016 | Odnoblyudov | F21S 4/24 362/249.02 |
| 2017/0227181 A1* | 8/2017 | Park | F21V 3/02 |

* cited by examiner

SYSTEMS AND METHODS FOR LIGHTING FIXTURES

CROSS-REFERENCE TO RELATED APPLICATIONS

This application is a continuation of U.S. patent application Ser. No. 16/239,668, entitled "Systems and Methods for Lighting Fixtures," filed Jan. 4, 2019, which is a continuation of U.S. patent application Ser. No. 15/829,197, entitled "Systems and Methods for Lighting Fixtures," filed Dec. 1, 2017, which claims a benefit of priority under 35 U.S.C. § 119 to U.S. Provisional Application No. 62/516,412 filed on Jun. 7, 2017, each of which are fully incorporated herein by reference in their entirety.

BACKGROUND INFORMATION

Field of the Disclosure

Examples of the present disclosure are related to systems and methods for lighting fixtures. More particularly, embodiments disclose lighting fixtures utilizing multiple bends in a light fixture comprised of metal-core PCB (MCPCB) for increasing efficiency in optical performance.

Background

Controlled environment agriculture, especially vertical farming is becoming more prevalent in the US and around the world. Vertical farming relies on light fixtures to illuminate a plant canopy. The light fixtures uniformly distribute radiant flux over the plant canopy, while removing heat from light sources (typically LEDs). The light fixtures' efficacy and cost directly impacts the operational expenses associated with vertical farming. As fixture height directly influences a number of vertical layers within a growth volume, it is important to minimize a form factor or vertical height of the fixture Operating higher-powered lights in a vertical growth is more costly than utilizing free sunlight in greenhouses or field-grown. To overcome these costs, vertical farming must have increased yields, shorter growth cycles, more consistent product, less water usage, reduce farm to plate timeframe, higher nutrient content, and other tangible advantages.

Accordingly, needs exist for more effective and efficient systems and methods for light fixtures with LEDS integrated directly into MCPCB, wherein the MCPCB includes one or more bends for optical controls to increase radiant flux on the plant and thus yield.

SUMMARY

Embodiments disclosed herein describe systems and methods for a light fixture that utilizes MCPCB and positioning of LEDs for optical controls. In embodiments, a substrate, such as a MCPCB sheet, may be directly populated with electronic components, such as LEDS, connectors, fuses, etc. The MCPCB sheet may then be coated for protection. The MCPCB sheet may then be cut into a single panel. Next, the single panel MCPCB is bent at least one time, wherein the length and angle of the bends may be utilized for optically controlling a distribution pattern and radiance of light emitted from the light sources on an area of interest. The bent MCPCB panel can then be assembled into a light fixture. Embedded light sources and corresponding electronics directly with a MCPCB may allow for lower material costs, lower labor costs, and superior thermal performance. Specifically, costs may be reduced by not requiring heatsink, adhesives, or other thermal interface materials. Additionally, costs may be reduced by not requiring fasteners, clips, etc. to couple the heatsink to the MCPCB.

Labor costs may also be reduced by removing the steps of adhesive dispensing or tape dispensing, MCPCB placement process, and time to cure or set the adhesive or tape.

Embodiments may include a MCPCB panel, at least one row of LEDs, and at least one bend in the MCPCB panel.

The MCPCB panel may be formed of copper, 3003 AL, 5052 AL, and/or other desired metals. In implementations, the preferred MCPCB may not be formed of a metal with a very low emissivity. To increase the emissivity of the MCPCB panel, the panel may be anodized, may have a solder mask that yields higher emissivity than anodized aluminum, and/or have a painted surface that yields higher emissivity than anodized aluminum.

The row(s) of LEDs may be positioned from a first end to a second end of the MCPCB panel, which may extend along the longitudinal axis of the MCPCB panel. The rows of LEDs may be symmetrically or asymmetrically spaced from the central axis of the MCPCB panel. Symmetrical implementations of the positioning of the LEDs may allow for even and symmetrical optical controls, and asymmetrical LED placement with regards to the longitudinal axis of the MCPCB may allow for asymmetrical light patterns.

The bends in the MCPCB may extend from the first end to the second end of the MCPCB panel. The bends may be configured to add rigidity and/or mechanical strength, add form for aesthesis, and allow for optical controls, such as being a diffuse/specular reflector. The bends in the MCPCB may be downward and outwardly angled bends, which are configured to extend away from the central axis of the MCPCB panel towards a lower surface. The angle and length of each of the bends may be configured to controls a light pattern positioned on an area of interest below the fixture.

Furthermore, in systems with multiple bends on each side of the light sources, the bends that encompasses the greatest angular subtense may affect the optical controls of the light fixture more than bends with smaller angular subtense.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
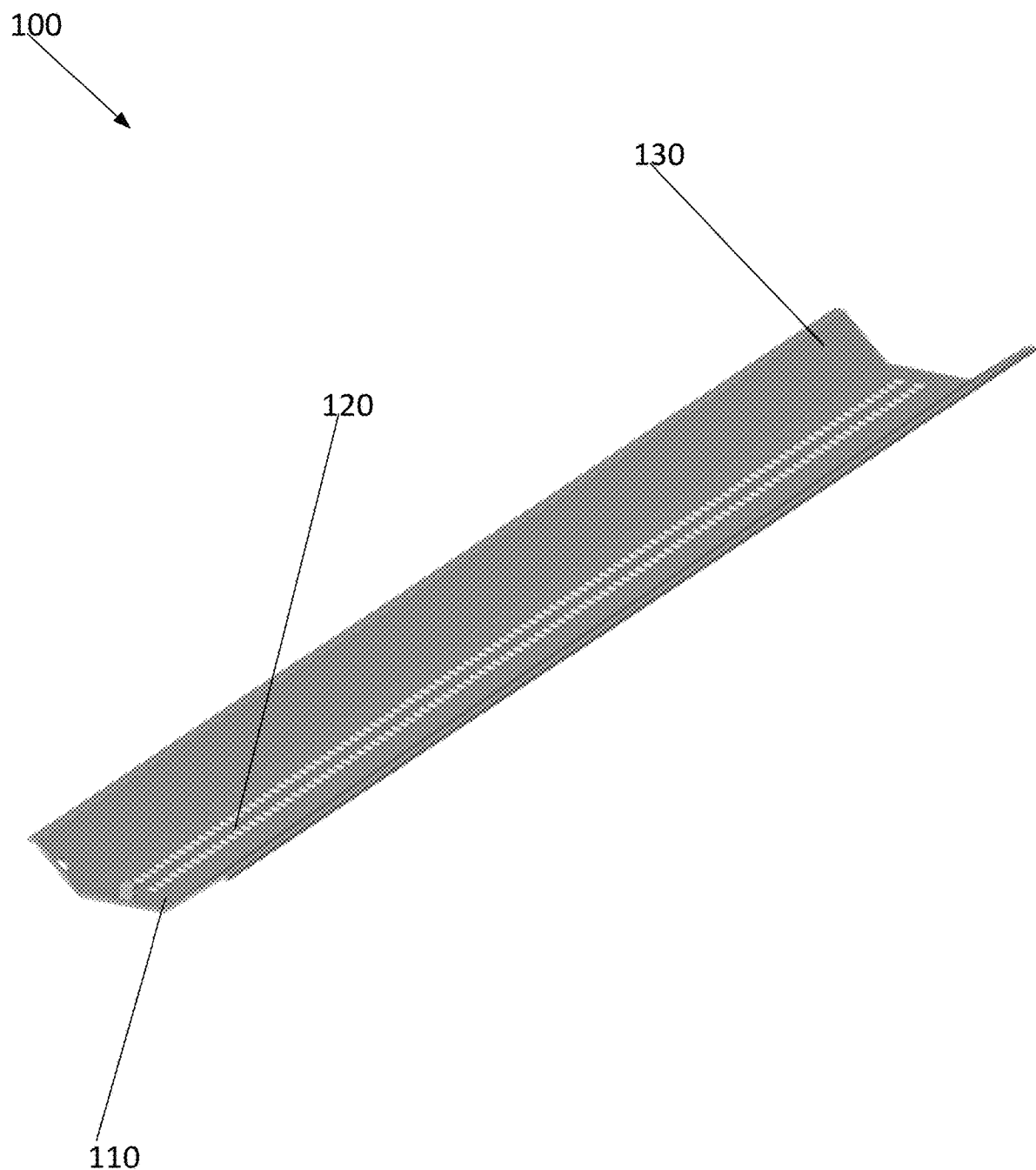
FIG. 1 depicts a light fixture system configured for optical controls, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

FIG. 1 depicts a light fixture system 100 configured for optical controls, according to an embodiment. System 100 may be configured to utilize bends in a MCPCB lighting fixture for optical controls. System 100 may include MCPCB 110, light sources 120, and bends 130. Utilizing bends 130, MCPCB 110 may optically control the light output from light sources 120.

MCPCB 110 may be formed of any metal, including: silver, tin, gold, copper, 3003 AL, 5052 AL, and/or other desired metals. In specific implementations, MCPCB 110 may be formed of a metal or substrate with a very low emissivity. However such a system would be much larger than a system with a high emissivity platform. To increase the emissivity of the MCPCB 110, MCPCB 110 may be anodized, may have a solder mask that yields higher emissivity than anodized aluminum, and/or have a painted surface that yields higher emissivity than anodized aluminum. MCPCB 110 may be positioned in a panel having a longer longitudinal axis than a lateral axis. MCPCB 110 may also include specular reflectors, diffuse reflectors, and engineered diffusers for beam control. For example, MCPCB 110 may utilize bare tin for specularly reflective surfaces or a secondary reflective surface such as adhering reflective tape, reflectors, Alanod, or other engineered diffusers to the MCPCB.

Light sources 120 may be light emitting diodes (LEDs) or any other device that is configured to emit light. Light sources 120 may be directly embedded or positioned on MCPCB 110, such that additional operations to affix tape or thermal adhesives to MCPCB 110, a heat sink, or both are not required. Light sources 120 may be positioned from a first end of MCPCB 110 to a second end of MCPCB 110. Light sources 120 may be configured to generate heat in response to creating and emitting light. Light sources 120 may be arranged on MCPCB 110 in a plurality of rows, or in any predetermined layout to generate a desired light pattern on an area of interest positioned below system 100. In embodiments, the rows of light sources 120 may be symmetrically placed around and/or through the central axis of MCPCB 110 to emit an even light pattern and to generate even amounts of heat. However, in other embodiments, the lights sources 120 may be asymmetrically positioned to generate a desired light pattern on a region of interest. In embodiments, reflectors and diffusers may be positioned around light sources 120 after the light sources 130 are positioned on MCPCB 110.

Bends 130 may be positioned from the first end to the second end of MCPCB 110. Bends 130 may be configured to add rigidity and/or mechanical strength to system 100, add form for aesthetics, operate as a heat sink to guide the flow of air, and allow for optical controls. Bends 130 may be positioned at an angle that is perpendicular to MCPCB 110 or positioned at an angle that is downward and away from a central axis of MCPCB 110. By angling bends 130 away from the central axis and towards a lower surface, thermal performance of system 100 may be increased. More specifically, air that is heated by light sources 120 (and other electronics) under MCPCB 110, may travel towards the lower distal ends of bends 130, around the distal ends of bends 130, and upwards towards the central axis of system 100 positioned above MCPCB 110. In embodiments, reflectors may be positioned on bends 130.

The heights of bends 130 may be based on the length of MCPCB 110, wherein the heights of bends may be the vertical distance from the distal ends of bends 130 to the upper surface of MCPCB 110. In embodiments where the length of MCPCB 110 is longer, the height of bends 130 may be taller. In embodiments where the length of MCPCB 110 is shorter, the height of bends 130 may be shorter.

In embodiments, based on the geometric properties of bends 130, bends 130 may be utilized for optical control of the light emitted from light sources 120. Specifically, the bends 130 may be used as a diffuse/speculator reflector for the light emitted from light sources 120. This may enable system 100 to alter, change, and/or create a desirable light pattern on an area of interest below system 100.

In embodiments, the materials, angles, lengths, heights, and/or other geometrical properties of bends 130 (or the panels created by bends) may be symmetrical across the central axis such that MCPCB 110 is isothermal. Yet, in other implementations, the materials, angles, lengths, heights, and/or other geometric properties of bends 130 (or the panels created by bends may be asymmetric. For example, different systems may be created with different geometric layouts. For example, system 100 may only include one row of light sources extending along the central axis of the MCPCB. Additionally, the length of the bends in other systems may be shorter than that of system 100, and the spacing of the lights in other systems may be different than that of system 100. The geometric properties of the different systems may be utilized for optical controls to emit different desired light patterns on different areas of interest.

Figure 2:
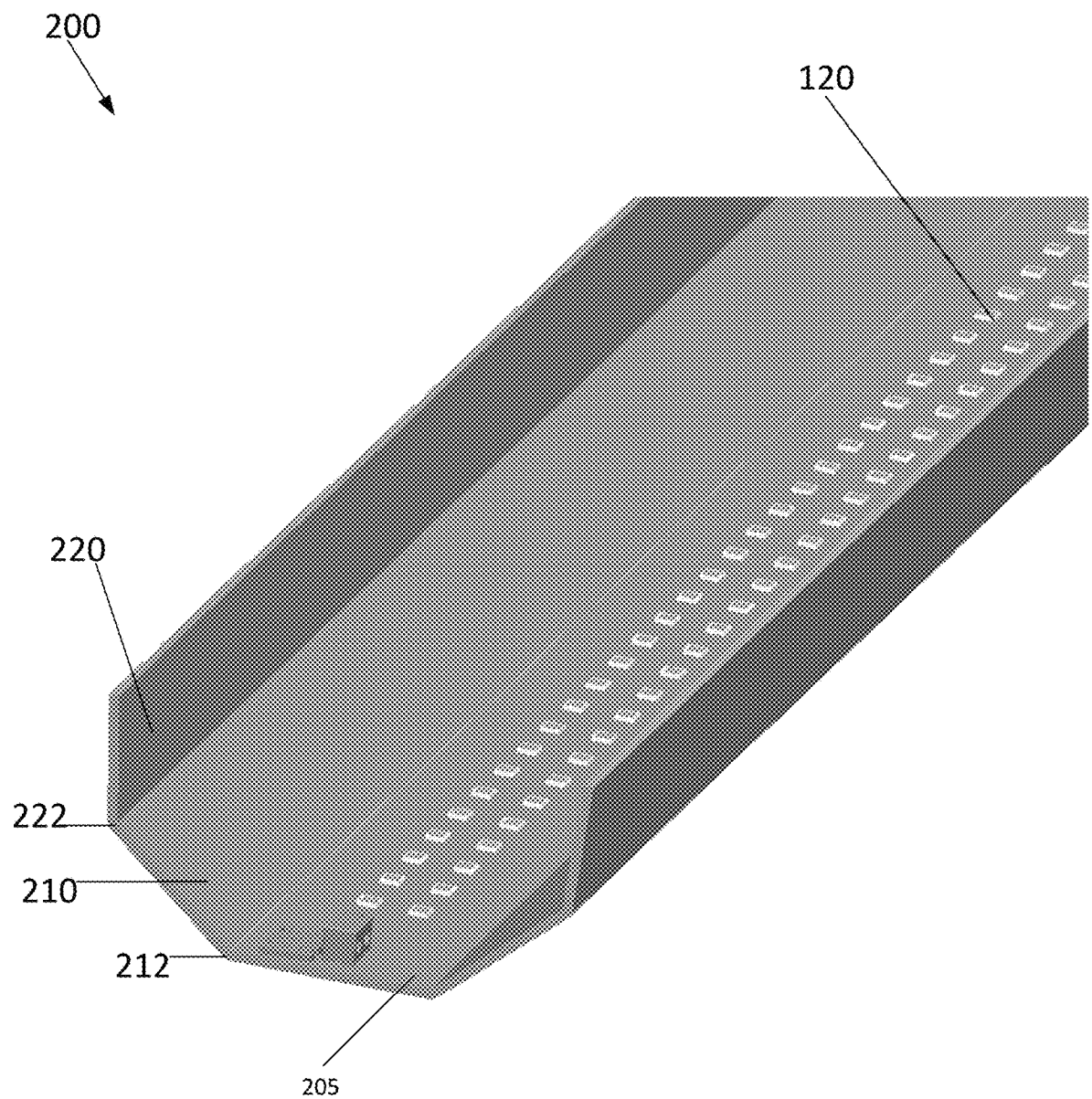
FIG. 2 depicts a system to optically control light patterns emitted from light sources, according to an embodiment.

FIG. 2 depicts a system 200 to optically control light patterns emitted from light sources 120, according to an embodiment. Elements depicted in FIG. 2 may be described above, and for the sake of brevity an additional description of these elements is omitted.

As depicted in system 200, MCPCB 110 may include multiple bends that form individual panels. Specifically, the system 100 depicted in FIG. 2 includes four bends with two bends 212, 222 positioned on both sides of a center panel 205 where light sources 120 are positioned. However, in other embodiments, system 100 may include any number of bends, which may be the same or different number on the different sides of center panel 205

First bend 212 may be positioned between center panel 205 and first panel 210, and second bend 222 may be positioned between second panel 220 and first panel 210. In embodiments, first bend 212 may be the same or different angle as second bend 222, and first panel 210 may be the same or different length as second panel 220.

In embodiments, the subtended angle from the center of the board to first bend 212 to a distal end of the outermost panel (second panel 220) may determine a level the optical control of system 200. The level of optical control may determine a light intensity, uniformity, spread, pattern etc. on an area of interest positioned below system 100. Increasing the subtended angle increases the level of optical control of light sources 120, whereas decreasing the subtended angle decreases the level of optical control of light sources 120. LED sources (as with most sources) are Lambertian emitters. In the MCPCB system, the sidewall reflectors modify the radiant intensity distribution from Lambertian. The maximum center beam radiant intensity may be calculated from the brightness equation:

$$\frac{\phi_1}{n_1 A_1 \Omega_1} = \frac{\phi_2}{n_2 A_2 \Omega_2}$$

Where $\phi$ is the flux, n is the index of refraction, A is the area and $\Omega$ is the solid angle of the system. Assuming the starting index of refraction of the source and the region of interest are the same (n=1 for air), the equation reduces to:

$$\frac{\phi_1}{A_1 \Omega_1} = \frac{\phi_2}{A_2 \Omega_2}$$

Radiant Intensity is Flux divided by solid angle.

$$\frac{\phi_1}{A_1 \Omega_1} A_2 = \frac{\phi_2}{\Omega_2} = \text{radiant intensity}$$

From the equation, Radiant intensity is proportional to the area of the optic. In this case the optic is the MCPCB reflector, and the area is the opening at the distal end of the bends. To increase radiant intensity, the exit aperture size of the optic needs to be proportionally increased.

Furthermore, a length of each of the panels 210, 220 may determine the effect of each of the panels 210, 220 on the overall light distribution of system 200. By increasing a length of a panel 210, 220, then that panel will have a greater effect of the overall light distribution of system 200. Conversely, decreasing the length of a panel 210, 200, may decrease the effect of the panel of the light distribution of system 200. Similarly, a specific angle of the bend 212, 222 may affect the light distribution of system 200, wherein increasing the angle of a bend 212, 222 increases the effect of the overall light distribution.

Figure 3:
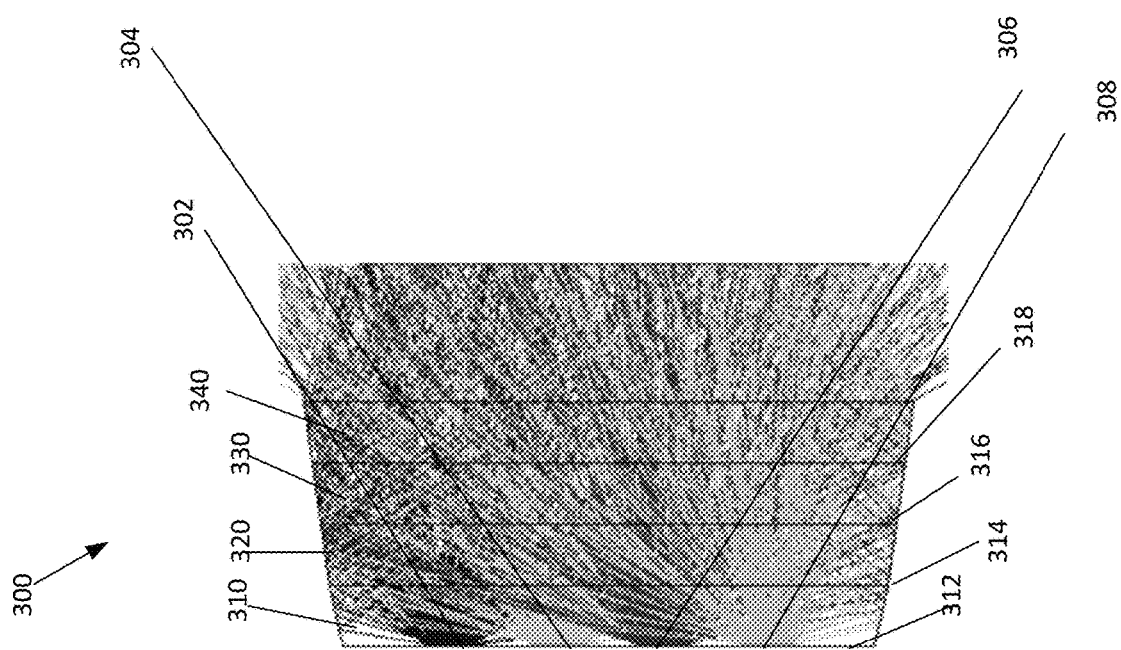
FIG. 3 depicts a system optically control light patterns emitted from light sources, according to an embodiment.

FIG. 3 depicts a system 300 to optically control light patterns emitted from light sources 302, 304, 306, 308, according to an embodiment. Elements depicted in FIG. 3 may be described above, and for the sake of brevity an additional description of these elements is omitted.

Figure 4:
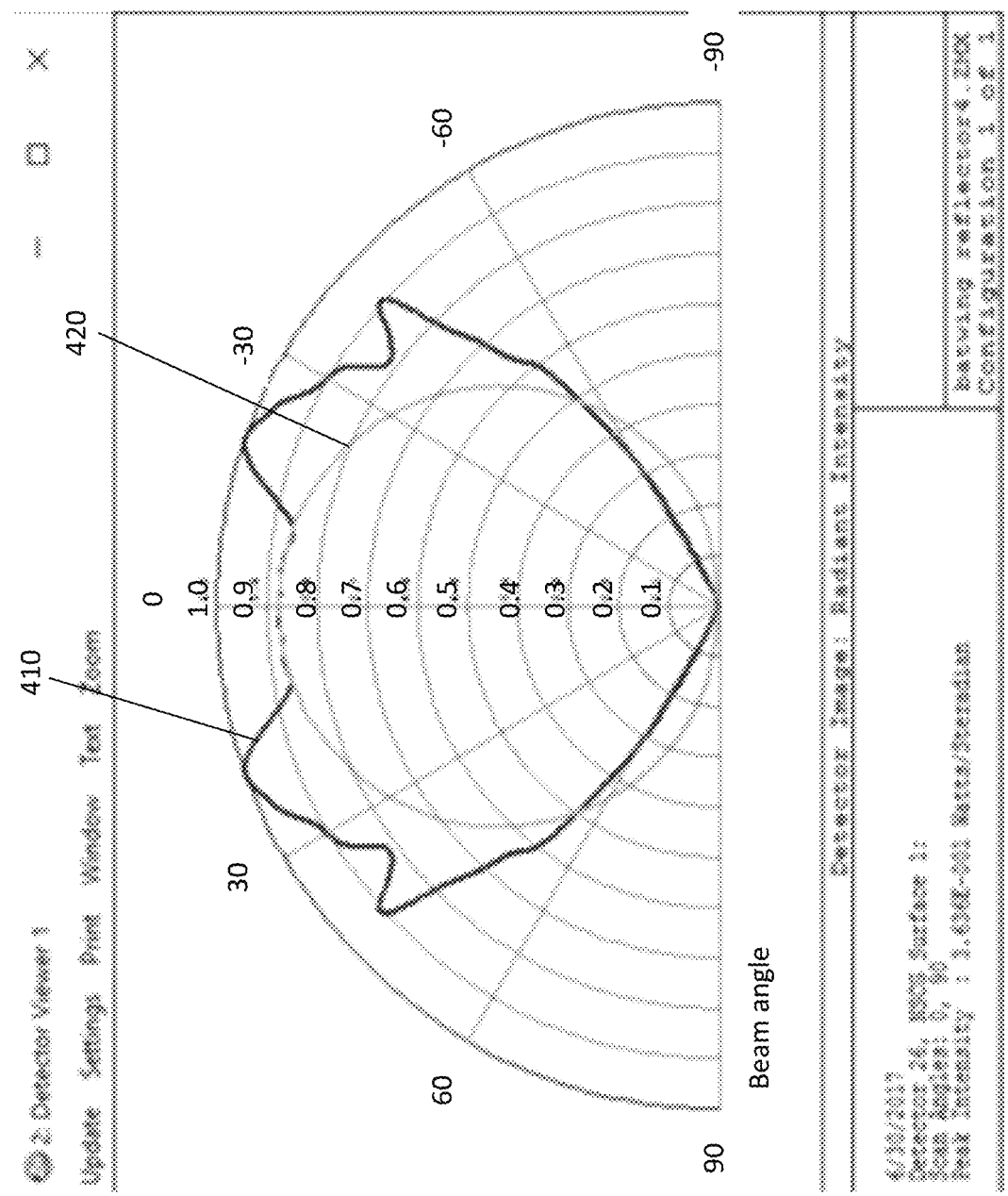
FIG. 4-5 depict a symmetrical light distribution pattern created by a system on an area of interest, according to an embodiment.

Specifically, FIG. 3 depicts an eight bend system for tighter optical controls, wherein four bends 312, 314, 316, 318 are positioned on each side of a the light sources 302, 304, 306, 308. The four bends 312, 314, 316, 318 may be utilized to create four panels 310, 320, 330, 340 having reflective surfaces. As depicted in FIG. 4, the four panels 310, 320, 330, 340 may have equal lengths. Furthermore, the light sources 302, 304, 306, 308 may be positioned equidistance from the first panels 312 positioned on both sides of the light sources 302, 304, 306, 308.

Figure 5:
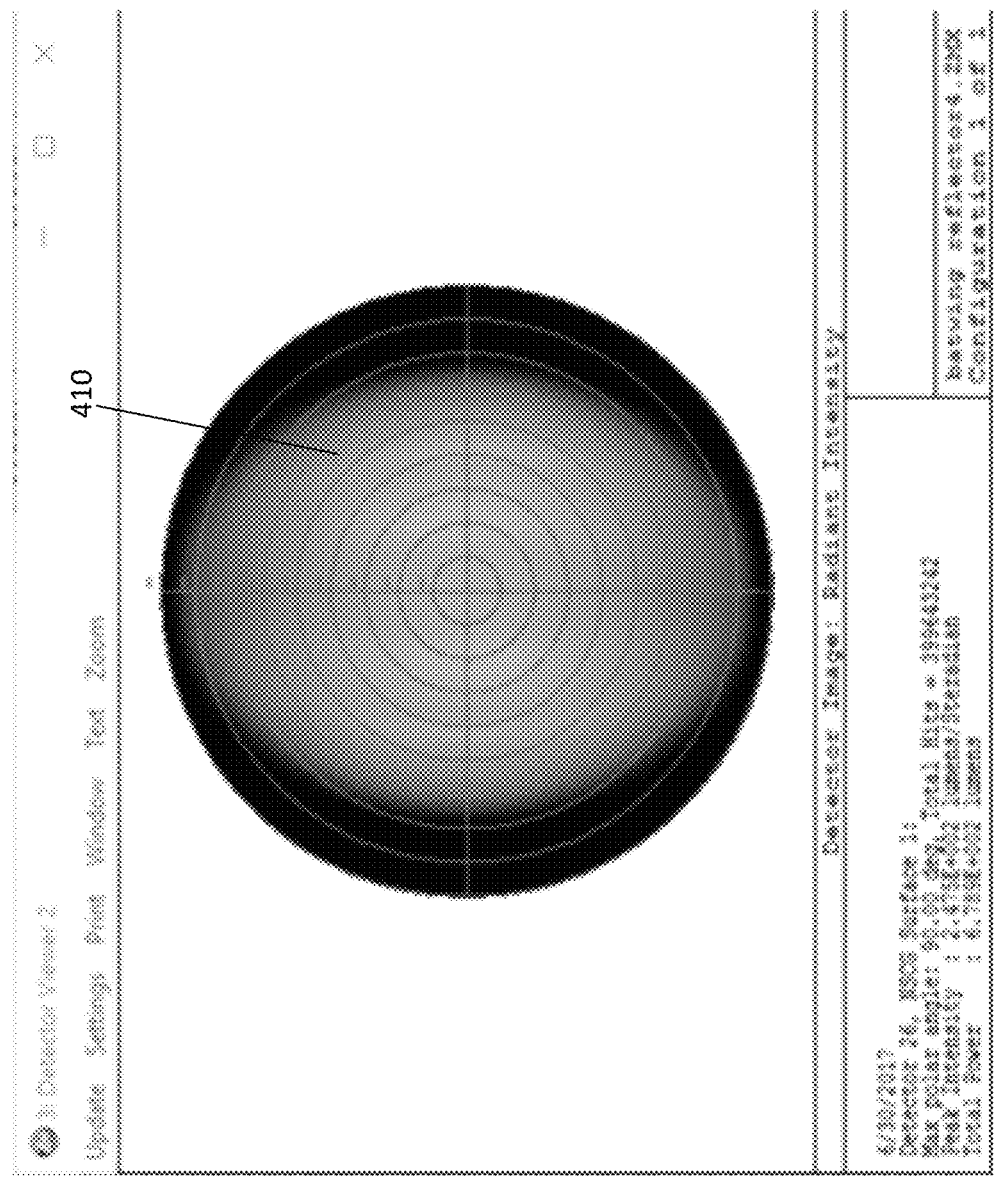

FIG. 4-5 depict a symmetrical light distribution pattern 410 created by system 300 on an area of interest 420 positioned below system 300. Furthermore, the light distribution pattern 410 created by system 300 may have a substantially uniform radiant intensity.

Figure 6:
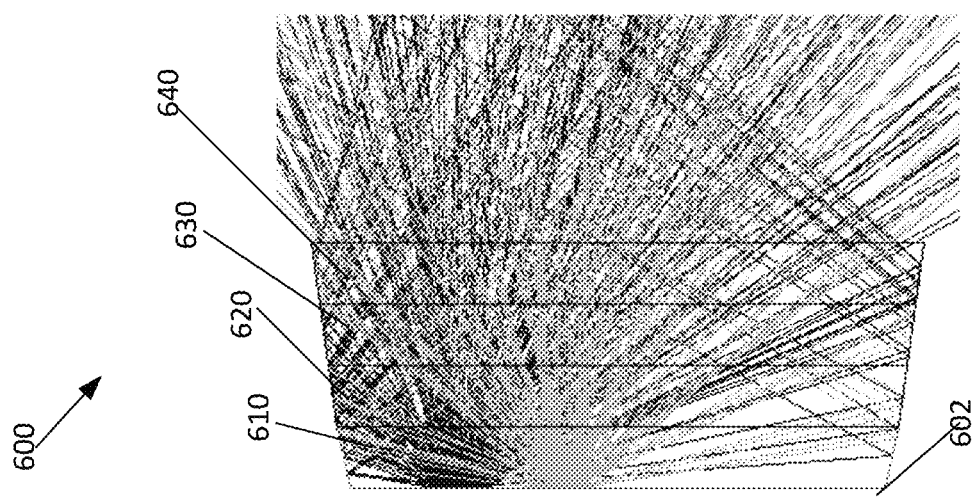
FIGS. 6-8 depict a system to optically control light patterns emitted from light sources, according to an embodiment.
Figure 7:
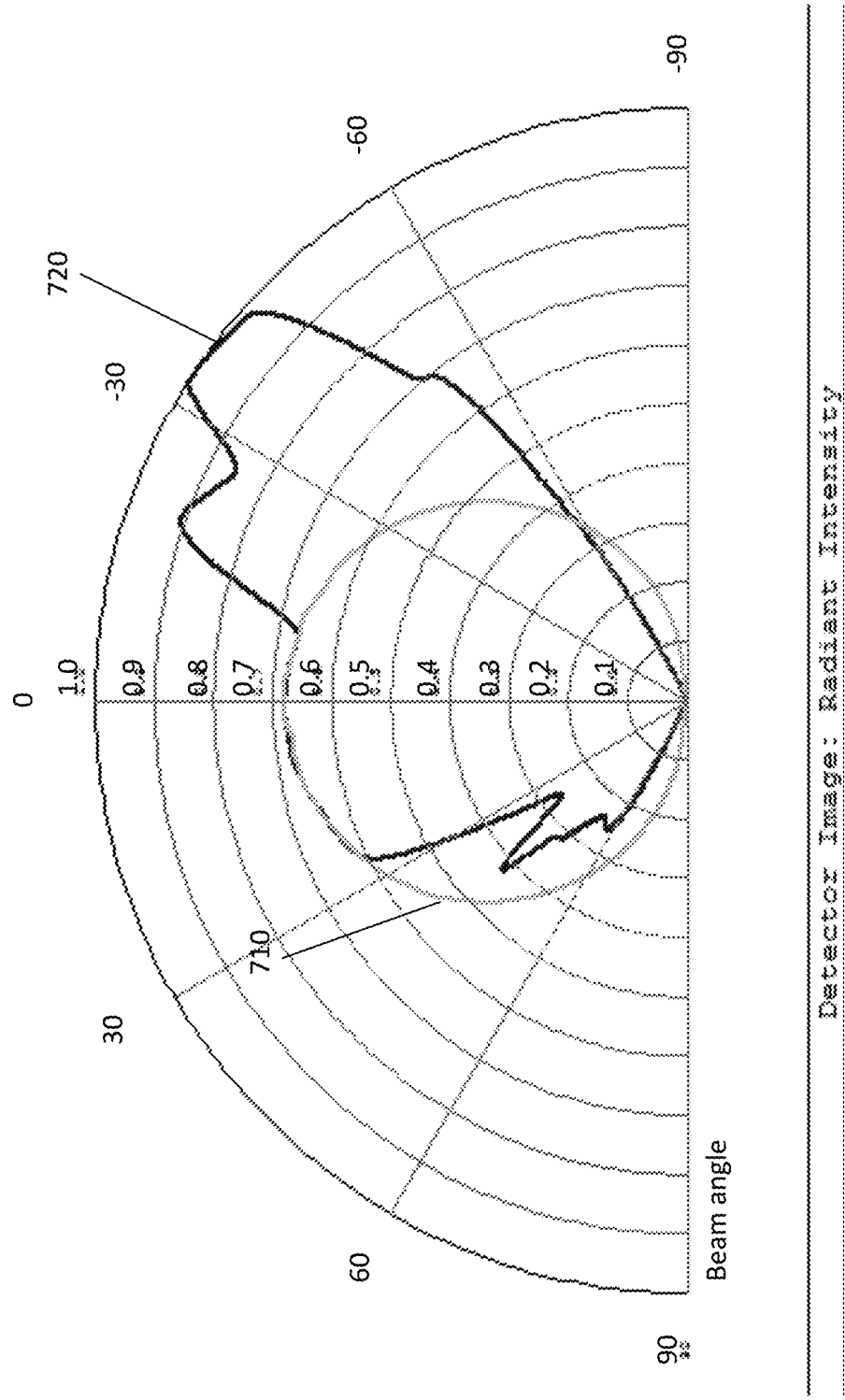
Figure 8:
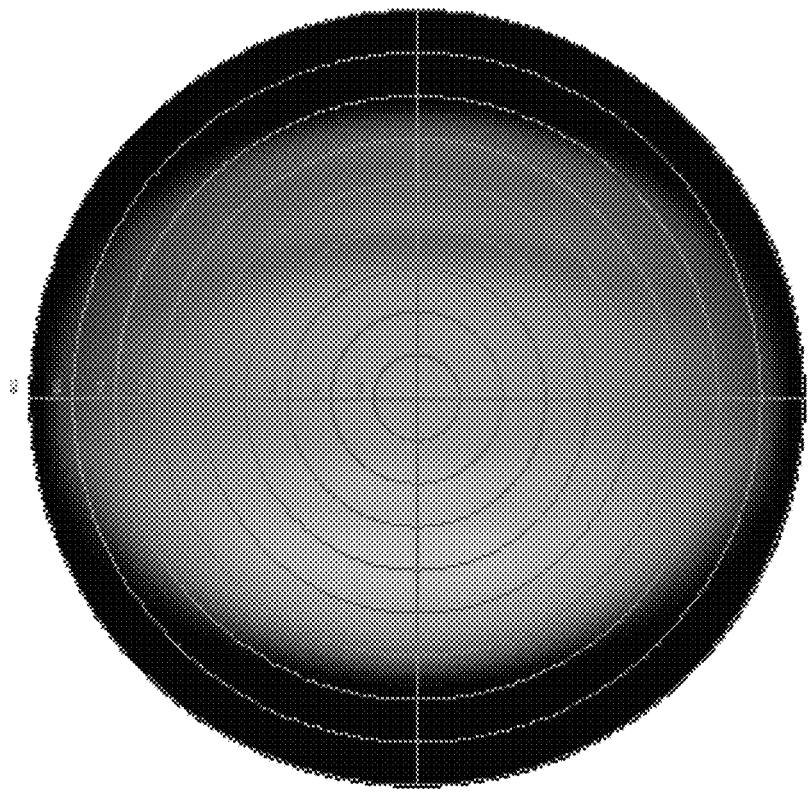

FIGS. 6-8 depict a system 600 to optically control light patterns emitted from light sources, according to an embodiment. Elements depicted in FIGS. 6-8 may be described above, and for the sake of brevity an additional description of these elements is omitted.

In system 600, the light sources 602, 604, 606, 608 may be positioned closed to one of the first bends 602 on either the right or the left sides of light sources 602, 604, 606, 608. This may be utilized to create an asymmetrical light distribution pattern 610 with an asymmetrical radiant intensity 620 on the area of interest. In system 600, the properties of the bends and the panels 610, 620, 630, 640 on the left and right sides of system 600 may be the same. Yet, because of the asymmetrical positioning of light sources 602, 604, 606, 608 on a center panel, the light distribution pattern 610 and radiant intensity 620 may be asymmetrical. However, in other embodiments, to create a asymmetrical light distribution pattern 610 or radiant intensity 620, the panel lengths, a number of panels, and bend angles on the left and right side of light sources 602, 604, 606, 608 may be different.

Figure 9:
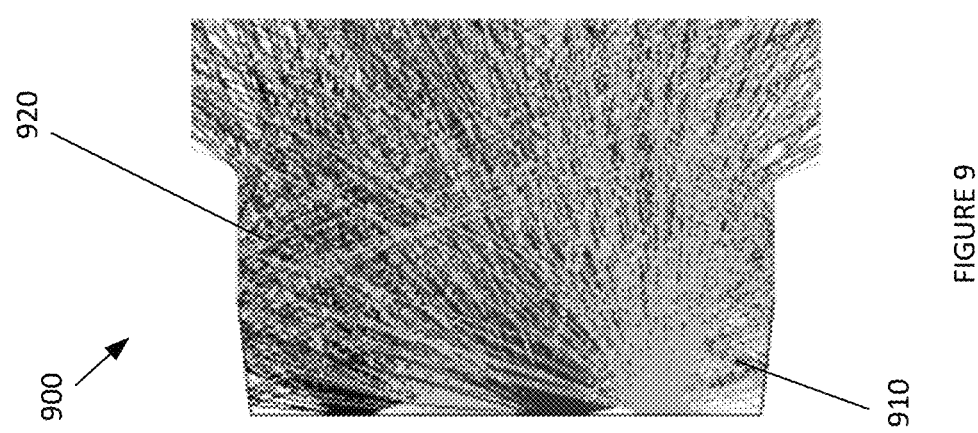
FIGS. 9-11 depict a system to optically control light patterns emitted from light sources, according to an embodiment.
Figure 10:
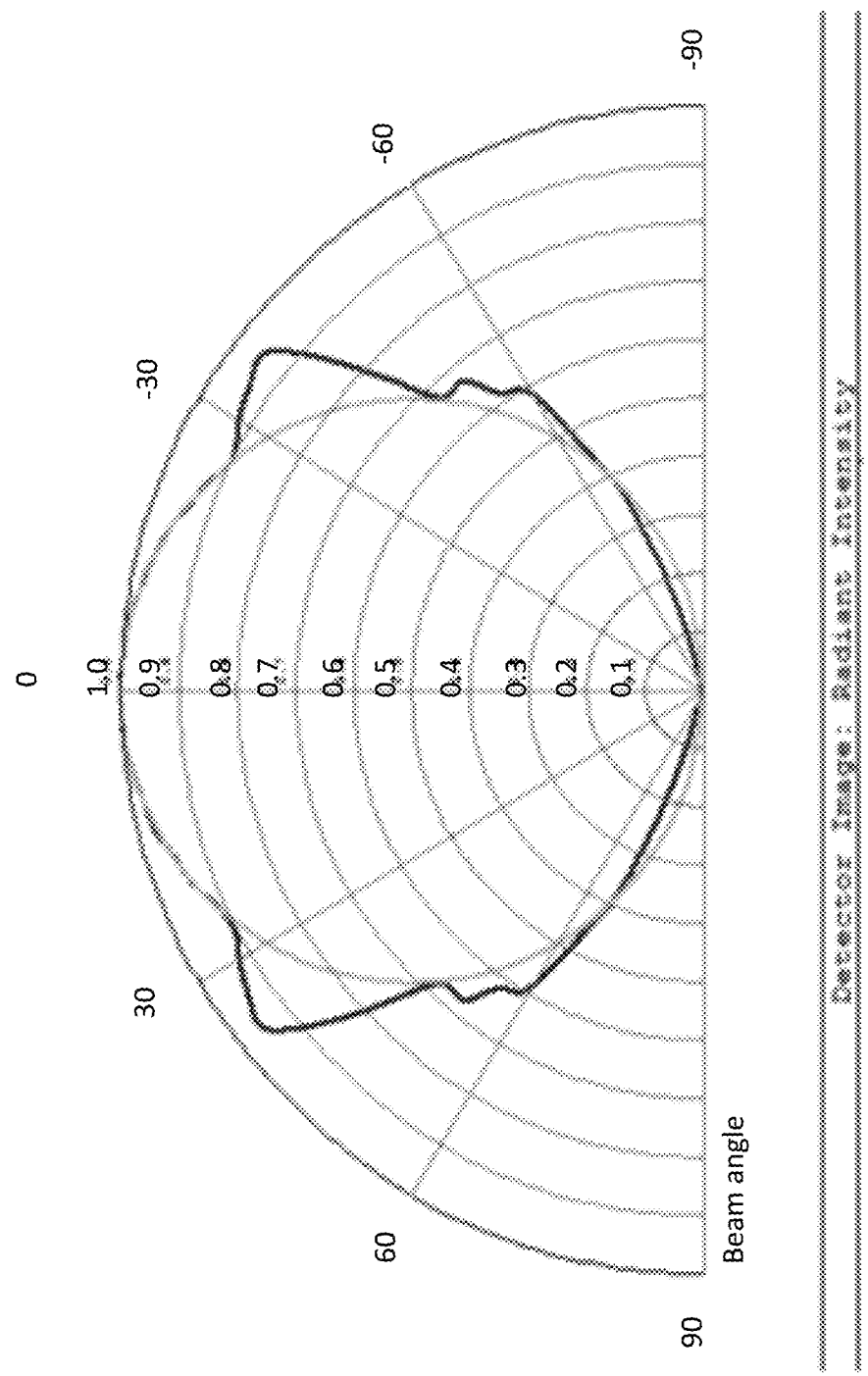
Figure 11:
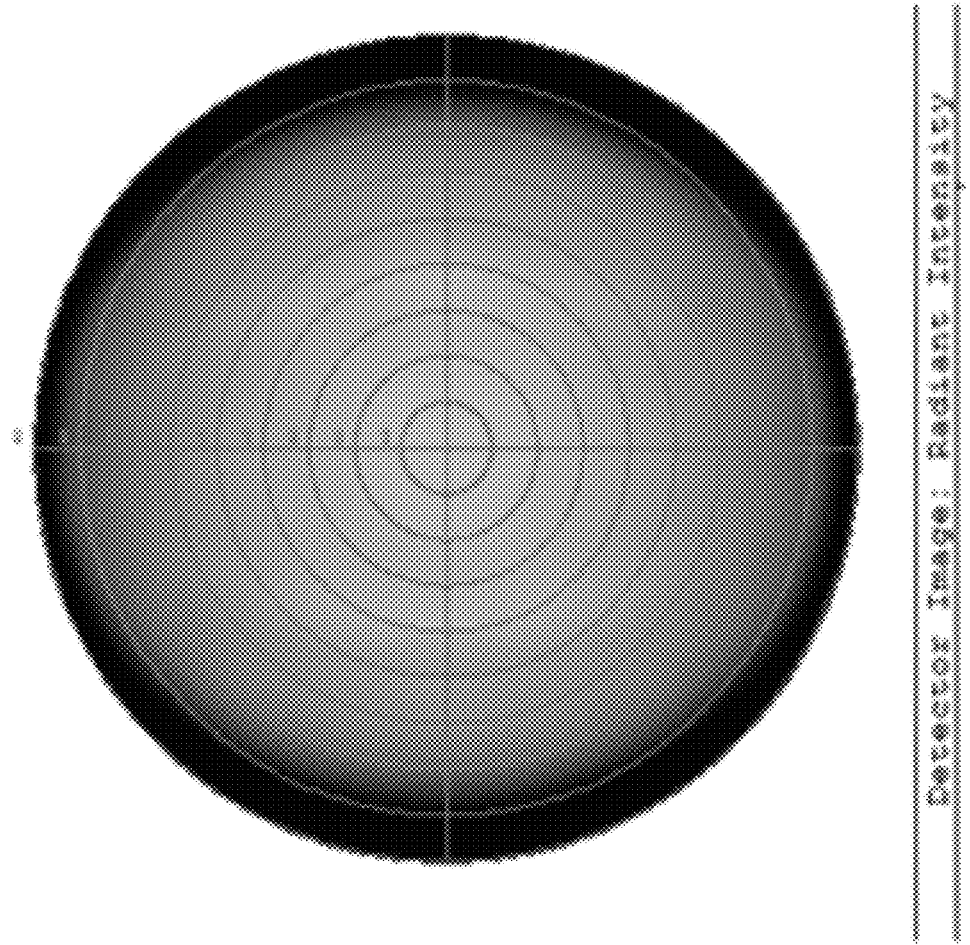

FIGS. 9-11 depict a system 900 to optically control light patterns emitted from light sources, according to an embodiment. Elements depicted in FIGS. 9-11 may be described above, and for the sake of brevity an additional description of these elements is omitted.

As depicted in FIGS. 9-11, system 900 may have two bends forming two panels 910, 920. The light sources associated with system 900 may be positioned equal distance from a first bend associated with panels 910 on each side of the light sources, wherein the panels 910, 920 and angles of the bends on both sides of the light systems may be the same. This layout may be utilized to create a symmetrical light distribution pattern on an area of interest positioned below system 900, with a substantially uniform radiant intensity.

Figure 13:
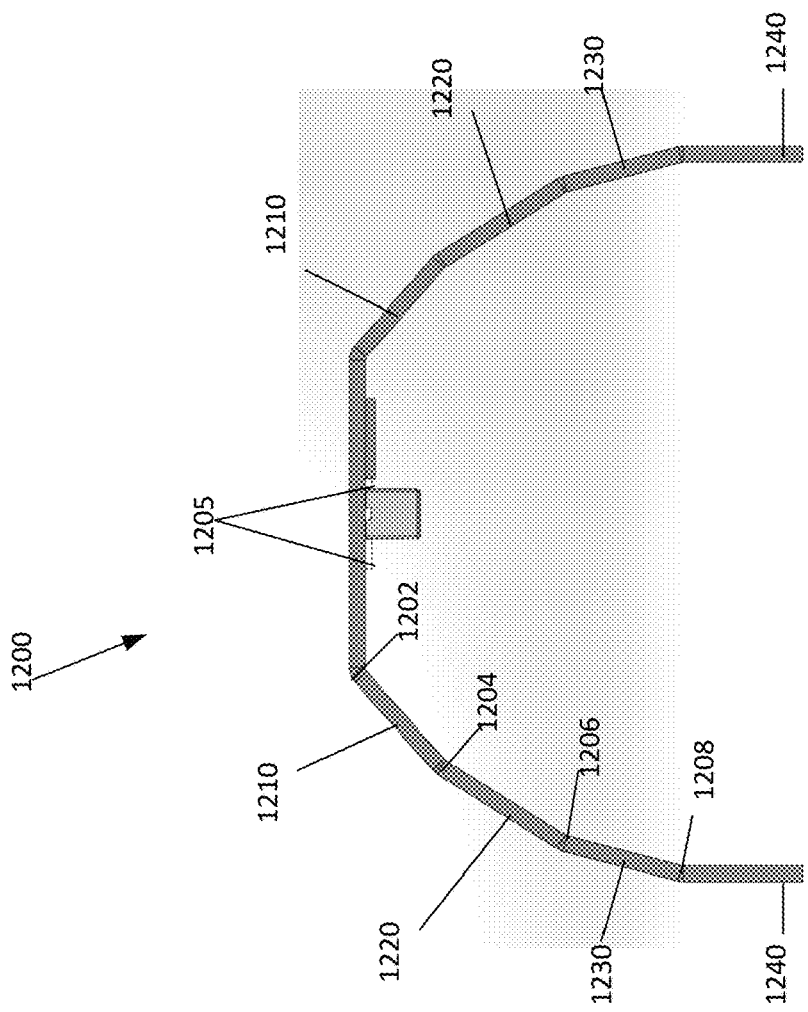
FIGS. 12-13 depict a system to optically control light patterns emitted from light sources, according to an embodiment.
Figure 12:
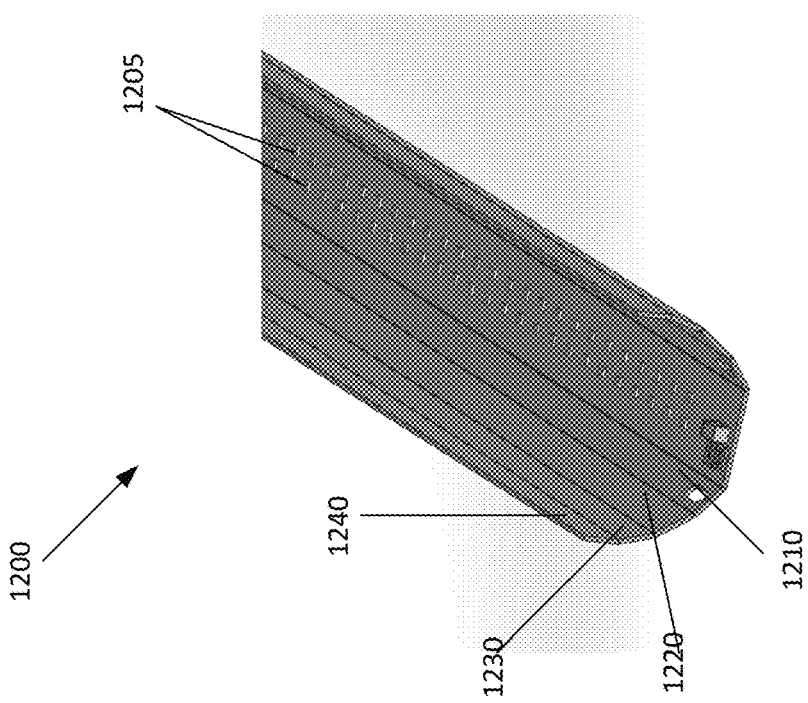

FIGS. 12-13 depict a system 1200 to optically control light patterns emitted from light sources, according to an embodiment. Elements depicted in FIGS. 12-13 may be described above, and for the sake of brevity an additional description of these elements is omitted.

As depicted in system 1200, system 1200 may include eight bends 1202, 1204, 1206, 1208, with four bends positioned on both sides of light sources 1205. This may result in eight panels 1210, 1220, 1230, 1240 within system 1200. Due to the positioning of light sources 1205 being equal distance to first bends 1202 and the characteristics of angles of bends 1202, 1204, 1206, 1208 and lengths of panels 1210,

1220, 1230, 1240 on both sides of light sources being equal, the light distribution pattern and radiant intensity on an area of interest below system 1200 may be symmetrical.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

We claim:

1. A system for optically controlling a light pattern, the system comprising:
    a substrate having a bottom surface and a top surface and a central longitudinal axis;
    one or more light sources embedded on the bottom surface of the substrate;
    a first panel extending along a first side of the substrate parallel to the central longitudinal axis, the first panel bent at a first angle with respect to the substrate; and
    a second panel extending along a side of the first panel, the second panel bent at a second angle with respect to the first panel;
    wherein air heated by the one or more light sources travels from below the bottom surface of the substrate around distal ends of the second panel and upwards towards the central longitudinal axis above the top surface of the substrate.

2. The system of claim 1, wherein the first angle is different than the second angle.

3. The system of claim 1, wherein the first panel extends away from a central axis of the substrate.

4. The system of claim 1, further comprising:
    a third panel extending along a second side of the substrate parallel to the central longitudinal axis;
    a fourth panel extending along a side of the third panel.

5. The system of claim 1, wherein at least one light source is positioned between the first side of the substrate and a second side of the substrate.

6. The system of claim 1, wherein values for the first angle and the second angle are chosen to achieve a desired light distribution and/or level of optical control.

7. The system of claim 6, wherein the level of optical control is associated with at least one of light intensity, uniformity, and spread of light emitted on an area of interest positioned below the substrate.

8. The system of claim 1, wherein the substrate is formed of metal core printed circuit board.

9. A method for optically controlling a light pattern comprising:
    forming a first panel along a first side of a substrate, wherein:
        the substrate has a bottom surface and a top surface and a central longitudinal axis parallel to the first side; and
        the first panel is bent at a first angle with respect to the substrate;
    forming a second panel along a side of the first panel, wherein the second panel is bent at a second angle with respect to the first panel; and
    embedding one or more light sources on the bottom surface of the substrate;
    wherein air heated by the one or more light sources travels from below the bottom surface of the substrate around distal ends of the second panel and upwards towards the central longitudinal axis above the top surface of the substrate.

10. The method of claim 9, wherein the first angle is different than the second angle.

11. The method of claim 9, wherein the first panel extends away from a central axis of the substrate.

12. The method of claim 9, further comprising:
    forming a third panel along a second side of the substrate parallel to the central longitudinal axis;
    forming a fourth panel along a side of the third panel.

13. The method of claim 9, further comprising:
    positioning at least one light source between the first side of the substrate and a second side of the substrate.

14. The method of claim 9, wherein values for the first angle and the second angle are chosen to achieve a desired light distribution and/or level of optical control.

15. The method of claim 14, wherein the level of optical control is associated with at least one of light intensity, uniformity, and spread of light emitted on an area of interest positioned below the substrate.

16. The method of claim 9, wherein the substrate is formed of metal core printed circuit board.

\* \* \* \* \*